(12) United States Patent
Pan et al.

(10) Patent No.: US 12,525,941 B2
(45) Date of Patent: Jan. 13, 2026

(54) PREPARATION METHOD FOR SURFACE ACOUSTIC WAVE DEVICE

(71) Applicant: TSINGHUA UNIVERSITY, Beijing (CN)

(72) Inventors: Feng Pan, Beijing (CN); Rongxuan Su, Beijing (CN); Fei Zeng, Beijing (CN); Junyao Shen, Beijing (CN); Sulei Fu, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 677 days.

(21) Appl. No.: 17/770,167

(22) PCT Filed: Jul. 14, 2020

(86) PCT No.: PCT/CN2020/101804
§ 371 (c)(1),
(2) Date: Apr. 19, 2022

(87) PCT Pub. No.: WO2021/088401
PCT Pub. Date: May 14, 2021

(65) Prior Publication Data
US 2022/0385267 A1    Dec. 1, 2022

(30) Foreign Application Priority Data

Nov. 7, 2019   (CN) .......................... 201911081522.8

(51) Int. Cl.
*H03H 3/08* (2006.01)
*C23C 14/00* (2006.01)
(Continued)

(52) U.S. Cl.
CPC ........... *H03H 3/08* (2013.01); *C23C 14/0036* (2013.01); *C23C 14/30* (2013.01);
(Continued)

(58) Field of Classification Search
CPC .. H03H 9/02582; H03H 9/14538; H03H 9/64; H03H 9/14544; H03H 9/02228;
(Continued)

(56) References Cited

U.S. PATENT DOCUMENTS

| | | | |
|---|---|---|---|
| 8,350,445 B1* | 1/2013 | Shirakawa | H03H 3/02 310/365 |
| 2003/0010624 A1* | 1/2003 | Voutsas | C23C 14/165 204/298.25 |

(Continued)

FOREIGN PATENT DOCUMENTS

| | | |
|---|---|---|
| CN | 102611405 A | 7/2012 |
| CN | 109802646 A | 5/2019 |

(Continued)

OTHER PUBLICATIONS

Müller et al., "SAW Devices Manufactured on GaN/Si for Frequencies Beyond 5 GHZ," in IEEE Electron Device Letters, vol. 31, No. 12, pp. 1398-1400, Dec. 2010. (Year: 2010).*

(Continued)

*Primary Examiner* — A. Dexter Tugbang
(74) *Attorney, Agent, or Firm* — HAUPTMAN HAM, LLP

(57) ABSTRACT

Disclosed are methods of preparing a Surface Acoustic Wave (SAW) device, comprising: sequentially depositing a Cu electrode, a silicon oxide film, modifying the surface of the silicon oxide film, and then depositing a piezoelectric film, and an Al electrode on a substrate having an interdigital (IDT) electrode pattern to obtain the SAW device. In some embodiments, the Cu and Al electrodes both have IDT electrode patterns corresponding to the IDT pattern of the substrate. Because the Sezawa wave mode that is adopted is formed by coupling film thickness vibration and transverse vibration, the present invention is characterized in that a longitudinal electric field and a transverse electric field are (Continued)

excited through the double-layer electrodes whereby the electromechanical coupling coefficient of the SAW device can be improved by changing the coupling pattern between the electric fields and the piezoelectric film.

19 Claims, 2 Drawing Sheets

(51) Int. Cl.
<table>
<tr><td>C23C 14/30</td><td>(2006.01)</td></tr>
<tr><td>H03H 9/02</td><td>(2006.01)</td></tr>
<tr><td>H03H 9/145</td><td>(2006.01)</td></tr>
<tr><td>H03H 9/64</td><td>(2006.01)</td></tr>
<tr><td>H03H 3/02</td><td>(2006.01)</td></tr>
</table>

(52) U.S. Cl.
CPC .... *H03H 9/02582* (2013.01); *H03H 9/14538* (2013.01); *H03H 9/64* (2013.01); *H03H 3/02* (2013.01); *H03H 2003/023* (2013.01)

(58) Field of Classification Search
CPC ........ H03H 9/02574; H03H 3/02; H03H 3/08; C23C 14/0036
See application file for complete search history.

(56) References Cited

U.S. PATENT DOCUMENTS

<table>
<tr><td>2004/0173816 A1*</td><td>9/2004</td><td>Saxler</td><td>H03H 3/08<br>257/195</td></tr>
<tr><td>2006/0097823 A1*</td><td>5/2006</td><td>Fujii</td><td>H03H 3/02<br>333/187</td></tr>
<tr><td>2015/0357555 A1*</td><td>12/2015</td><td>Umeda</td><td>H03H 3/02<br>204/192.18</td></tr>
<tr><td>2017/0085247 A1*</td><td>3/2017</td><td>Ruby</td><td>H03H 9/64</td></tr>
<tr><td>2017/0111028 A1*</td><td>4/2017</td><td>McCarron</td><td>C23C 14/0036</td></tr>
</table>

FOREIGN PATENT DOCUMENTS

<table>
<tr><td>CN</td><td>110113025 A</td><td>8/2019</td></tr>
<tr><td>CN</td><td>110138356 A</td><td>8/2019</td></tr>
<tr><td>CN</td><td>1110086446 A</td><td>8/2019</td></tr>
<tr><td>JP</td><td>2006279777 A *</td><td>10/2006</td></tr>
</table>

OTHER PUBLICATIONS

First Office Action issued in corresponding Chinese Application No. 201911081522.8; mailed May 20, 2020, 9 pgs.
Second Office Action issued in corresponding Chinese Application No. 201911081522.8; mailed Sep. 25, 2020, 10 pgs.
International Search Report issued in International Application No. PCT/CN2020/101804; mailed Sep. 29, 2020; 5 pgs.

* cited by examiner

PREPARATION METHOD FOR SURFACE ACOUSTIC WAVE DEVICE

RELATED APPLICATIONS

The present application is a U.S. National Phase of International Application Number PCT/CN2020/101804 filed Jul. 14, 2020, and claims priority to Chinese Application Number 201911081522.8 filed Nov. 7, 2019.

FIELD OF THE INVENTION

The present disclosure relates to the field of information and electronic materials, and in particular to a surface acoustic wave device having a high electromechanical coupling coefficient based on double-layer electrodes and a preparation method for the same.

BACKGROUND OF THE INVENTION

Surface acoustic wave (SAW) devices are electronic devices that transmit information based on the piezoelectric effect, and it has undergone rapid development in the past few decades. With emerging of 5G (5th Generation Mobile Communication Technology), demands for SAW devices with zero temperature coefficient of frequency, small size, and large bandwidth are increasingly intense.

Traditional SAW devices are based on piezoelectric single crystal materials, such as $LiNbO_3$ and $LiTaO_3$ which are relatively expensive and have a high requirement on crystal cut. A piezoelectric film-based SAW device has advantages, such as a wide frequency range and simplicity of preparation, and thereby can better meet requirements of miniaturization and integration for the SAW device. Besides, resonance frequency and electromechanical coupling coefficient of the piezoelectric film-based device can be adjusted by selecting different substrate material. Current mainstream piezoelectric film materials include two types, i.e., ZnO and AlN. Compared with the AlN, the ZnO has advantages, such as less temperature coefficient of frequency, larger electromechanical coupling factor, and easier preparation, and it thus has greater potential for preparation of a high frequency, low insertion loss and large bandwidth SAW filter. However, ZnO film-based SAW currently adopted is mainly Sezawa wave mode, which is reported to have a relatively low electromechanical coupling factor compared with bulk based SAW devices. As an important parameter of the surface acoustic wave device, the bandwidth directly depends on the electromechanical coupling factor of resonators. Therefore, in order to better apply the ZnO film material to the 5G SAW device, improvement of the electromechanical coupling coefficient of the devices is quite indispensable.

SUMMARY OF THE INVENTION

An objective of the present disclosure is to provide a SAW device and a preparation method for the same. Through the present disclosure, a high electromechanical coupling factor can be realized through double-layer electrodes.

The SAW device provided by the present disclosure has a structure including:
a Cu electrode, a piezoelectric film and an Al electrode arranged in sequence on a substrate;
wherein a signal terminal of the Cu electrode is opposite to a ground terminal of the Al electrode and a ground terminal of the Cu electrode is opposite to a signal terminal of the Al electrode so that an electric field along a direction of thickness can be excited.

In the above-mentioned SAW device, a thickness of the Cu electrode may be 50-100 nm, such as 75 nm, 50-75 nm or 75-100 nm; and a thickness of the Al electrode may be 50-100 nm, such as 75 nm, 50-75 nm or 75-100 nm.

In the above-mentioned SAW device, the piezoelectric film may be at least one of a ZnO film, an AlN film, a doped ZnO film, and a doped AlN film, and preferably a ZnO film.

In the above-mentioned SAW device, a thickness of the piezoelectric film may be 100-1500 nm, such as 300 nm, 100-300 nm, or 300-1500 nm.

In the above-mentioned SAW device, the substrate may be a c-plane sapphire substrate, SiC or diamond.

In the above-mentioned SAW device, a gap provided between the substrate and the piezoelectric film (that is, a gap excluding the Cu electrode) is filled with a silicon oxide film.

The SAW device of the present disclosure may be prepared according to following method 1) or 2):

1) In the case that the gap between the piezoelectric film and the substrate is filled with no silicon oxide film, the SAW device is obtained by depositing the Cu electrode, the piezoelectric film and the Al electrode on the substrate in sequence.

2) In the case that the gap between the piezoelectric film and the substrate is filled with a silicon oxide film, the Cu electrode and the silicon oxide film are deposited on the substrate in sequence, and then the piezoelectric film and the Al electrode are successively deposited on the silicon oxide film after a surface of the silicon oxide film has been modified by chemically mechanical polishing.

In the abovementioned preparation method, the Cu electrode and the Al electrode are prepared through electron beam evaporation.

Conditions of the electron beam evaporation include that:
an evaporation source is small particles of Al metal or small particles of Cu metal, the purity of which is 99.999%;
a chamber pressure is $10^{-6}$~$10^{-5}$ Pa;
a temperature is 10~100° C.;
a distance between a target and the substrate is 50-100 cm; and
an evaporation rate is 0.1~2 Å/s.

After the evaporation is completed, it further includes filling nitrogen into the vacuum chamber of the electron beam evaporation until the pressure in the vacuum chamber becomes atmospheric pressure, and then taking out the prepared metal film.

In the abovementioned preparation method, the silicon oxide film is prepared through radio frequency magnetron sputtering.

Conditions of the radio frequency magnetron sputtering include that:
a target may be a silicon target with a diameter of 75 mm and a purity of 99.999%;
a flow rate of working gas (argon and oxygen) may be 10-30 mL/min, specifically, 18 mL/min for argon and 12 mL/min for oxygen;
a magnetron sputtering source is a plane target magnetron sputtering source;
a power is 1000 W;
a temperature is 20~400° C.;
a pressure of chamber is 0.5~1.2 Pa; and
a distance between the target and the substrate is 60-80 mm.

In the above-mentioned preparation method, the ZnO film is prepared through radio frequency magnetron sputtering.

Conditions of the radio frequency magnetron sputtering include that:

- a target may be a zinc target with a diameter of 75 mm and a purity of 99.999%;
- a flow rate of working gas (argon and oxygen) may be 10-30 mL/min, specifically, 18 mL/min for argon and 12 mL/min for oxygen;
- a magnetron sputtering source is a plane target magnetron sputtering source;
- a power is 140 W;
- a temperature is 20~400° C.;
- a pressure of chamber is 0.5~1.2 Pa; and
- a distance between the target and the substrate is 60-80 mm.

DETAILED DESCRIPTION OF THE EMBODIMENTS

Figure 1:
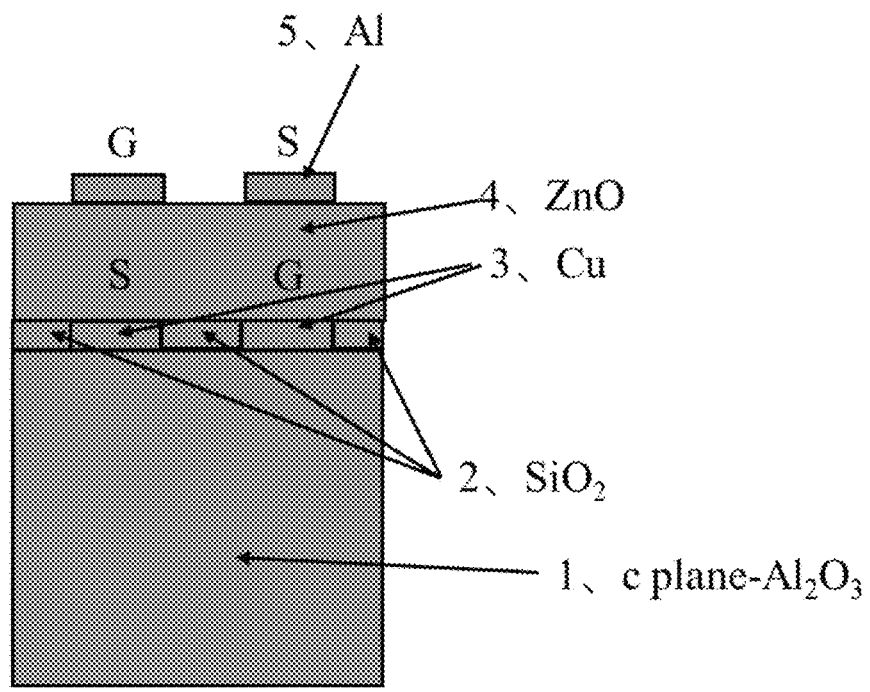
FIG. 1 is a schematic cross-sectional view of a SAW device of double-layer electrodes according to an embodiment of the present disclosure, in which 1—c-plane sapphire; 2—SiO$_2$; 3—Cu; 4—ZnO; 5—Al.

Experimental methods used in the following embodiments are those routine methods in the art, unless otherwise specified herein.

Materials and reagents used in the following embodiments are available commercially, unless otherwise specified herein.

Embodiment 1

1) A c-plane sapphire substrate having a 2 microns periodic interdigital electrode pattern is prepared by photolithography. After photolithography is applied, the substrate is placed in an electron beam evaporation coater, in which a vacuum system is enabled to evacuate to 9×10$^{-6}$ Pa, a power of an electron gun is adjusted to 20%, and a target (purity: 99.999%) is cleaned for 5 min.

2) After the power indicator is stable, a target baffle is opened, and an evaporation rate of Cu electrode material is 0.4 Å/s, and it is deposited 75 nm.

3) After the evaporation is complete, the power supply is turned off. Then, fill the vacuum chamber of the electron beam evaporation coating machine with nitrogen until the pressure in the vacuum chamber reaches atmospheric pressure Then, the chamber is opened to take out the sapphire substrate, on which a Cu electrode has been prepared by the evaporation process.

4) The substrate after lift-off process is placed into a magnetron sputtering chamber for growth of a silicon dioxide film. A radio frequency sputtering mode is selected, in which a distance between the target and the substrate is set to 70 mm, a power is set to 1000 W, an argon flow rate is set to 18 ml/min, an oxygen flow rate is set to 12 ml/min, and a gas pressure is stabilized at 0.5 Pa. Before the baffle is opened, pre-sputtering is performed for about 180 s, a sputtering time is controlled at 6 s, and it is deposited 75 nm.

5) After the sputtering is completed, the power supply is turn off. Then, the magnetron sputtering vacuum chamber is filled with nitrogen until a pressure in the vacuum chamber becomes the atmospheric pressure, and then it is opened to take out the substrate. The surface of the silicon dioxide film is trimmed by chemically mechanical polishing to ensure flatness of the substrate during growth of ZnO 6) A ZnO film is sputtered on the polished substrate surface. A radio frequency sputtering mode is selected, in which a distance between a target and the substrate is set to 70 mm, a power is set to 140 W, an argon flow rate is set to 18 ml/min, an oxygen flow rate is set to 10 ml/min, a gas pressure is stabilized at 0.8 Pa, and a temperature is stabilized at 350° C. Before the baffle is opened, pre-sputtering is performed for about 180 s, a sputtering time is controlled at 2250 s, and it is deposited 300 nm.

7) An upper electrode pattern is prepared through photo-etching nesting process so that a ground terminal of the upper electrode is opposite to a signal terminal of the lower electrode. Next, an Al upper electrode is prepared by electron beam evaporation coating, a specific process of which is similar to the above step 1), where an evaporation rate of Al was 0.5 Å/s and it is deposited 75 nm.

8) The film prepared in the step 7) is peeled off in acetone to obtain a desired SAW device, a structural schematic diagram of which is shown in FIG. 1.

A SAW device of single-layer electrode (Al electrode, a thickness of which is the same as a thickness of the Al electrode of the double-layer electrode structure) is prepared according to the steps 1), 6) and 7) in Embodiment 1.

Figure 2:
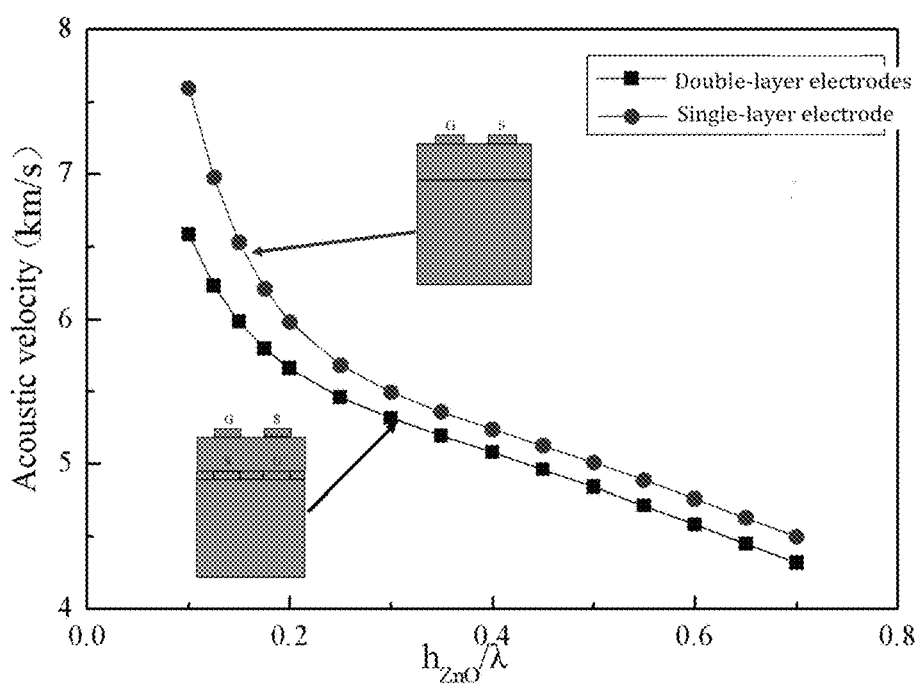
FIG. 2 is a schematic diagram of acoustic velocity varying as a normalized thickness of piezoelectric film that is obtained by finite element method simulation.
Figure 3:
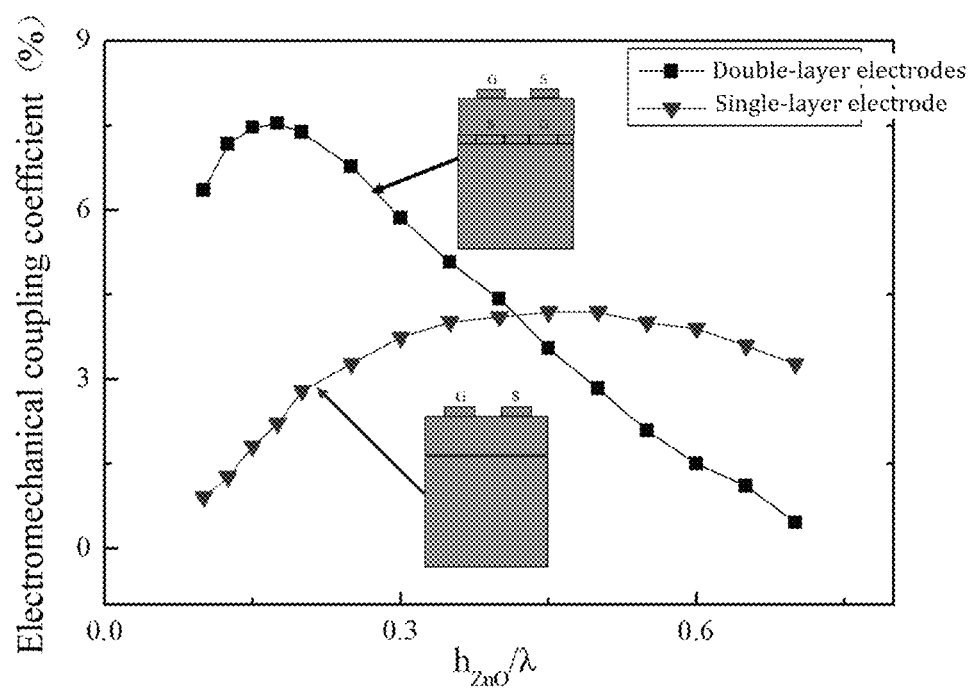
FIG. 3 is a schematic diagram of an electromechanical coupling coefficient varying as a function of a normalized thickness of piezoelectric film that is obtained by finite element method simulation.

The performance of the above-prepared SAW devices of double-layer electrodes and of single-layer electrode are predicted through a COMSOL finite element simulation, respectively. A resulted schematic diagram of acoustic velocity varying as a function of a normalized thickness of a piezoelectric film is shown in FIG. 2. A resulted schematic diagram of an electromechanical coupling coefficient varying as a function of the normalized thickness of the piezoelectric film is shown in FIG. 3. It can be seen that, in the case that the normalized thickness ratio is 0.175, a maximum of the electromechanical coupling coefficient of the SAW device of double-layer electrodes of the present disclosure is about 7.5%. Although the SAW of single-layer electrode has a higher acoustic velocity, a maximum of the electromechanical coupling coefficient is only half of that of the double-layer electrode device. Therefore, the double-layer electrode structure provided by the present disclosure can, under the premise of ensuring high acoustic velocity, significantly improve the electromechanical coupling coefficient of the SAW device, which provides a practical solution for the future large-bandwidth SAW filter.

INDUSTRIAL APPLICATION

The present disclosure has the following beneficial effects.

Since the adopted Sezawa wave mode is formed by coupling film thickness vibration and transverse vibration, the present disclosure is characterized in that a longitudinal electric field (in a direction of thickness of a film) and a transverse electric field (in a propagation direction of SAW) are excited through the double-layer electrodes so that the electromechanical coupling coefficient of the SAW device can be improved by changing a coupling pattern between the electric fields and the piezoelectric film.

What is claimed is:

1. A surface acoustic wave (SAW) device, comprising:
a copper (Cu) electrode comprising a ground terminal and a signal terminal;
a piezoelectric film; and
an aluminum (Al) electrode comprising a ground terminal and a signal terminal are arranged, in sequence, on a substrate comprising an interdigital (IDT) electrode pattern,
wherein the signal terminal of the Cu electrode is arranged opposite the ground terminal of the Al electrode,
wherein the ground terminal of the Cu electrode is arranged opposite the signal terminal of the Al electrode, and
wherein the Cu electrode and the Al electrode both comprise first and second IDT electrode patterns, respectively, in accordance with the IDT electrode pattern on the substrate.

2. The SAW device according to claim 1, wherein
a thickness of the Cu electrode is 50-100 nm; and
a thickness of the Al electrode is 50-100 nm.

3. The SAW device according to claim 1, wherein
the piezoelectric film consists of at least one film selected from the group consisting of a ZnO film, an AlN film, a doped ZnO film, a doped AlN film, and combinations thereof.

4. The SAW device according to claim 1, wherein a thickness of the piezoelectric film is 100-1500 nm.

5. The SAW device according to claim 1, wherein the substrate consists of a material selected from the group consisting of c-plane sapphire, SiC, and diamond.

6. The SAW device according to claim 1, wherein
a gap provided between the substrate and the piezoelectric film is filled with a silicon oxide film.

7. A preparation method of the SAW a Surface Acoustic Wave (SAW) device, comprising the steps of:
depositing a copper (Cu) electrode on a substrate having a primary interdigital (IDT) electrode pattern;
depositing a silicon dioxide film on the copper electrode and the substrate;
polishing the silicon dioxide film to obtain a modified silicon dioxide film;
depositing a piezoelectric film on the modified silicon dioxide film; and
forming an aluminum (Al) electrode on the modified silicon dioxide film;
wherein the Cu electrode has a first IDT electrode pattern and the Al electrode has a second IDT electrode pattern, and
further wherein the first and second IDT electrode patterns complement the primary interdigital (IDT) electrode pattern.

8. The preparation method according to claim 7, wherein the Cu electrode and the Al electrode are prepared using an electron beam evaporation coating process.

9. The preparation method according to claim 8, wherein conditions of the electron beam evaporation coating include that:
a temperature is 10-100° C.; and
a distance between a target and the substrate is 50-100 cm.

10. The preparation method according to claim 7, wherein a surface of the silicon oxide film is modified with a chemically mechanical polishing (CMP) process.

11. The preparation method according to claim 7, wherein the silicon oxide film is deposited using a process of radio frequency magnetron sputtering.

12. The preparation method according to claim 11, wherein deposition conditions for the radio frequency magnetron sputtering comprise:
a magnetron sputtering source consisting of a plane target magnetron sputtering source;
a sputtering power of 1000 W;
a sputtering temperature is 20-400° C.;
a sputtering system pressure of 0.5-1.2 Pa; and
a distance between a target and the substrate is 60-80 mm.

13. The preparation method according to claim 7, wherein the piezoelectric film is deposited using radio frequency magnetron sputtering.

14. The preparation method according to claim 13, wherein operating conditions for the radio frequency (RF) magnetron sputtering include:
a plane target magnetron sputtering source;
a RF power of 140 W;
a sputtering temperature of 20-400° C.;
a sputtering system pressure of 0.5-1.2 Pa; and
a distance between the plane target magnetron sputtering source and the substrate is 60-80 mm.

15. The preparation method according to claim 7, wherein
a thickness of the Cu electrode is 50-100 nm; and
a thickness of the Al electrode is 50-100 nm.

16. The preparation method according to claim 7, wherein the piezoelectric film comprises at least one film selected from the group consisting of a ZnO film, an AlN film, a doped ZnO film, a doped AlN film, and combinations thereof.

17. The preparation method according to claim 7, wherein a thickness of the piezoelectric film is 100-1500 nm.

18. The preparation method according to claim 7, wherein the substrate is a c-plane sapphire substrate, SiC or diamond.

19. A method for manufacturing a SAW filter having a high acoustic velocity and a high electromechanical coupling coefficient, comprising:
incorporating a SAW device according to claim 7 into the SAW filter.

* * * * *